United States Patent [19]

Tombrello et al.

[11] Patent Number: 4,526,624
[45] Date of Patent: Jul. 2, 1985

[54] ENHANCED ADHESION OF FILMS TO SEMICONDUCTORS OR METALS BY HIGH ENERGY BOMBARDMENT

[75] Inventors: Thomas A. Tombrello, Altadena, Calif.; Yuanxun Qiu, Shanghai, China; Marcus H. Mendenhall, Lawrenceburg, Ind.

[73] Assignee: California Institute of Technology, Pasadena, Calif.

[21] Appl. No.: 394,816

[22] Filed: Jul. 2, 1982

[51] Int. Cl.³ .................... H01L 21/265; C23C 13/02
[52] U.S. Cl. .................... 148/1.5; 29/576 B; 29/576 T; 29/571; 148/187; 427/38
[58] Field of Search ............. 148/1.5, 187; 29/576 T, 29/576 B, 571; 357/91; 427/38

[56] References Cited

U.S. PATENT DOCUMENTS

| | | | |
|---|---|---|---|
| 3,535,775 | 10/1970 | Garfinkel | 29/584 |
| 3,682,729 | 8/1972 | Gukelberger et al. | 156/643 |
| 3,733,222 | 5/1973 | Schiller | 148/1.5 |
| 3,967,982 | 7/1976 | Arndt et al. | 148/1.5 |
| 4,147,564 | 4/1979 | Magee et al. | 148/1.5 |
| 4,278,475 | 7/1981 | Bartko et al. | 148/1.5 |
| 4,323,590 | 4/1982 | Lipperts | 427/38 |
| 4,352,835 | 10/1982 | Holbrook et al. | 427/38 |
| 4,364,969 | 12/1982 | Dearnaley et al. | 427/38 |
| 4,457,972 | 7/1984 | Griffith et al. | 428/334 |

FOREIGN PATENT DOCUMENTS

| | | | |
|---|---|---|---|
| 39864 | 4/1978 | Japan | 29/576 B |
| 33817 | 4/1981 | Japan | 29/576 B |

OTHER PUBLICATIONS

Nishi et al. in Ion Implantation in Semiconductors, Ed., S. Namba, Plenum, N.Y., 1975, pp. 347-354.
Wang et al., J. Vac. Sci. Technol., 16, (1979), 130.
Weyer et al., Phys. Rev. Letts., 44, (1980), 155.
Grob et al., Nuclear Instruments & Methods, 182-83, (1981), 85.

Primary Examiner—Upendra Roy
Attorney, Agent, or Firm—Marvin E. Jacobs

[57] ABSTRACT

Films (12) of a metal such as gold or other non-insulator materials are firmly bonded to other non-insulators such as semiconductor substrates (10), suitably silicon or gallium arsenide by irradiating the interface with high energy ions. The process results in improved adhesion without excessive doping and provides a low resistance contact to the semiconductor. Thick layers can be bonded by depositing or doping the interfacial surfaces with fissionable elements or alpha emitters. The process can be utilized to apply very small, low resistance electrodes (78) to light-emitting solid state laser diodes (60) to form a laser device 70.

15 Claims, 9 Drawing Figures

ENHANCED ADHESION OF FILMS TO SEMICONDUCTORS OR METALS BY HIGH ENERGY BOMBARDMENT

ORIGIN OF THE INVENTION

The invention described herein was made in the performance of work under contracts with the National Science Foundation and with NASA and is subject to the provisions of Section 305 of the NASA Act of 1958, Public Law 86-568 (72 Stat. 435; 42 USC 2457) and to the provisions of the NSF Act.

BACKGROUND OF THE INVENTION

The present invention relates to direct adhesion of materials and, more particularly, to improving the adhesion of a film of a material to a semiconductor by irradiating the interface between the surfaces with high energy ions.

Though the invention is of general application in its ability to enhance the adhesion of any conductor or semiconductor to any conductor or semiconductor substrate, there are many semiconductor substrates that do not form stable, adherent bonds even with pretreatment of the surface. Metal films applied to these surfaces by evaporation sometimes form weakly adherent bonds that can be readily peeled off the surface. Furthermore, it is difficult to reliably apply these metal films to semiconductors in a manner resulting in a low resistance contact.

There are many applications where the service life of the device is severely limited by the non-permanence of the interfacial bond between a metal film and a semiconductor. For example, many small and intricately shaped devices such as the contacts to solid state lasers used for coupling to optical fiber communication cables are difficult to coat and present techniques are not amenable to forming very narrow electrodes of the order of 1000 Angstroms or less that are solderable. Other products currently being produced and/or developed that require bonding of a thin film of metal to a semiconductor substrate are semiconductor junctions and other semiconductor devices such as photovoltaic cells.

DESCRIPTION OF PRIOR ART

Ion-beam-induced atomic mixing is a well-known technique for improving the bonding at an interface between dissimilar materials. For many years it has been widely known that bombarding the interface between two materials with low energy ions in the nuclear stopping region ($E \lesssim$ a few keV/amu) causes the two media to intermix and usually results in an improved bond. However, these processes, which are associated with sputtering, result in disruption of the film and the beam particles have a short path after reaching the interface resulting in contamination or doping of one or the other of the materials at the interface. The low energy beams are limited to use with very thin layers of material and cause a violent disruption of metallic layers.

U.S. Pat. No. 3,682,729 discloses a low energy bombardment technique to relieve stress in and/or to firmly adhere thin film coatings to a substrate material. The energies of the ions used in all the examples cited place them well within the range where nuclear energy loss processes for the incident ions predominate. The statements describing the mechanism upon which the technique is based confirm this. For example, see Column 2, line 69 through Column 3, line 2. In this instance it is clear that the atoms of the film and substrate are caused to intermix under the bombardment.

For one set of examples cited the bombarding ions do not penetrate the film, e.g. 280 KeV Ar ions incident on a 10,000 Å molybdenum film (Column 7, lines 16-24). The implanted ions in the film appear to effect the substrate, e.g., by improving corrosion resistance. In Column 7, lines 51-54 it is stated, however, that the damage effect of the ions (i.e., the nuclear recoils produced in the slowing down process) controls the change in film properties rather than any chemical effect. For these cases any change in adherence cannot arise from effects at the interface because the bombarding ions do not penetrate that deeply.

In cases where improved adherence is demonstrated (Column 7, line 66, Column 8, line 12), the bombarding ions are well within the energy range where nuclear energy losses predominate.

Recently, it has been disclosed in copending application Ser. No. 327,896, filed Dec. 7, 1981, now U.S. Pat. No. 4,457,972 that improved adhesion to an insulator occurs on irradiating the interface of a metal or semiconductor with an insulator with ions having energies in the regime where nuclear energy loss processes are negligible and electronic processes predominate. It was believed that mechanism was associated with track-forming processes occurring in the electronic stopping region for the bombarding ion and that the process was only effective if one or both of the materials at the interface was an electrical insulator having a resistivity exceeding $10^3$ ohm-cm. Though the application discloses adhering metal to an integrated circuit, it was believed that a silicon dioxide layer present on the surface of the silicon chip provided the insulator necessary for the proposed mechanism. Similarly, in Example 4 in which silicon was bonded to silicon nitride, the bonding was believed due to the presence of the silicon nitride insulator.

DISCLOSURE OF THE INVENTION

It has now been discovered in accordance with this invention that high energy bombardment ($E100 \lesssim$ keV/amu; where amu is an abreviation for atomic mass unit) of an interface including at least one non-insulator such as a semiconductor or a metal material results in enhanced adhesion of the material to the surface.

The mechanism that produces the bonding is not understood. It was believed that bonding was associated with the sputtering mechanism that operates in this high energy range and that enhanced bonding should appear in the electronic stopping region only if one or both of the media are electrical insulators. However, unexpectedly, films of metal are firmly attached to semiconductors when bombarded with ions having energies in the stated range and, further, these contacts have a resistance lower by at least an order of magnitude than evaporated metal film contacts, The moving atoms in the disrupted medium have energies that are much lower than those generated in the collision cascades produced by low energy ions. If there is mixing at the interface, the mixed layer should not be very thick. The high energy mechanism has several advantages over the low energy one. The high energy particles penetrate much deeper into a solid, which allows the technique to be used with thick films while minimizing doping effects at the interface. In addition, a high energy beam of ions does not disrupt a metallic layer as violently as a low energy one. In particular, the high energy beam does not sputter away the metallic film while the low energy beam does. Furthermore, the high energy mechanism is in some cases extraordinarily efficient. For example, a gold film can be bonded to a semiconductor with a fluence of as little as $10^{14}/cm^2$ of 20 MeV $^{35}Cl$ ions. Also, the ions used in some of the high energy cases can be produced with radioactive nuclei such as alpha emitters and fissionable elements, thus, obviating the need for an accelerator. Moreover, an interface deep within a sample could be doped with the appropriate material, which would produce the desired result through spontaneous or neutron induced emission of energetic ions. This would permit bonding of extremely large surfaces quickly and inexpensively. The ability to collimate the high energy beam makes possible the fabrication of extremely small contacts of the order of 100 to 10,000 Angstroms, preferably below 1000 Angstroms.

The process could also be used to bond semiconductors to semiconductors or metals to metals. High energy ion beams can be produced with a modest apparatus. A one milliamp heavy ion beam could bond metals to semiconductors at a rate of over 10 cm²/sec. Nuclear reactions and alpha emitters could also be used to perform the bombardments. For instance, in a nuclear reactor, reactions like $^{235}U(n,f)$ could be used to bond metals to semiconductor substrates with very large surface areas. Since neutrons can penetrate deep into a solid, the process is not limited to bonding thin films to substrates. In addition, high energy ion beams have advantages over low energy ion-induced mixing. The beam particles travel far beyond the bonded interface so they do not contaminate it. Furthermore, a high energy ion beam would not sputter away the metal film as a low energy beam would. In many ways this high energy mechanism could be more convenient to use than low energy ion techniques.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1:
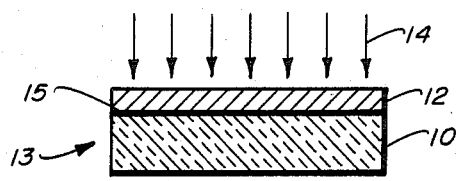
FIG. 1 is a schematic view of a first embodiment of a process for adhering a film to a substrate according to this invention.
Figure 2A:
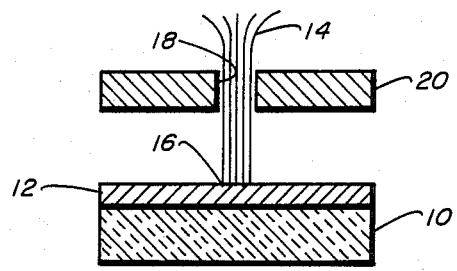
FIGS. 2a and 2b are schematic views of another embodiment of the invention for adhering a portion of the film to the surface of a semiconductor substrate.
Figure 2B:
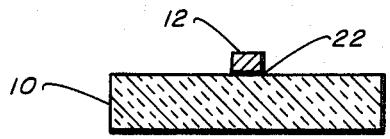

In its simplest form, a semiconductor substrate 10 as illustrated in FIG. 1 is first coated with a film 12 such as a film of metal. The coated substrate 13 is then subjected to high energy bombardment which penetrates through the film 12 to the interface 15 and results in firm adherence of the film 12 to the substrate 10. As illustrated in FIG. 2, less than all of the film 12 may be adhered to the substrate 10 by restricting the beam to a narrow line 16 suitably by passing the beam 14 through the opening 18 in a collimator or focusing assembly 20. The film of metal is readily removed from non-irradiated areas to form a firmly adherent line 22 of metal on the substrate 10.

Another means of selectively writing and adhering a line of film on the substrate is to mount the substrate in a fixture connected to a translation means or the irradiation source can be connected to a translation means. The collimated beam is then applied to the moving substrate. After removal of the non-irradiated, non-adherent portion of the film, a pattern such as an electrode comb pattern remains on the substrate.

Relatively thick semiconductor materials or materials having complex shapes can be joined by generating energetic ions directly at the interface by doping either one or both surfaces with radioactive nuclei such as alpha emitters or fissionable elements and nuclei that undergo neutron induced reactions that produce charged particles. Ions are produced through spontaneous or neutron induced emission of energetic ions from the nuclei. This avoids the need to utilize an accelerator. Any of these methods can be utilized to bond a three layer sandwich. A thin film of metal could be interposed between two sheets of semiconductors. On generation of high energy ions which penetrate the film and invade the surface of each of the semiconductors, a firmly adherent three layer laminate can be produced.

At least one of the materials at the interface is a semiconductor solid having a resistivity less than $10^3$ ohm-cm, and a band gap from 0.01 eV to 5 eV, typically from 0.1 eV to 2.0 eV. Semiconducting materials can be crystalline or amorphous. Generally, the parent, intrinsic semiconducting materials are pure elements of Groups III, IV or VI of the Periodic Table such as silicon, germanium, tin, selenium, tellurium or boron or binary or higher compounds such as tabulated below:

TABLE 1

| III-V Compounds | | II-VI Compounds |
|---|---|---|
| GaAs | $(GaAl)_xAs_{1-x}$ | PbSe |
| AlAs | $GaAs_xP_{1-x}$ | PbTe |
| GaSb | $(GaIn)_xAs_{1-x}$ | PbS |
| InP | $(GaIn)_xAs_{1-x}$ | ZnS |
| InAs | $InAs_xP_{1-x}$ | CdTe |
| InSb | | $(PbSn)_xTe_{1-x}$ |
| GaSb | | $(HgCd)_xTe_{1-x}$ |
| AlSb | | | where x is a number from 0.01 to 0.99

The semiconductors are doped with electron donors (n) or electron acceptors (p) to increase carrier density for conduction. For example, silicon and germanium are usually doped with Group IIB donor impurities such as Sb, As or P and/or with acceptor impurities such as aluminum, boron, gallium or indium from Group IIIB of the Periodic Table.

Figure 3:
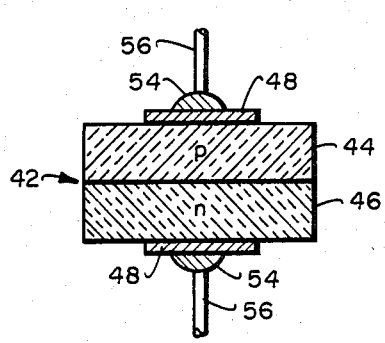
FIG. 3 is a schematic view of an embodiment of a semiconductor device containing an electrode produced by the method of the invention.

Some devices such as thermistors can be fabricated from intrinsic semiconductors which are in the form of a disc or rod to which a pair of ohmic contacts is applied. Most semiconductor devices as shown in FIG. 3 contain a pn-junction 42 formed by a layer 44 of p-type material adjacent a layer 46 of n-type material. The device also contains a set of electrodes 48 for applying a bias across the junction or for removing current as in a photovoltaic cell. The electrodes 48 as formed in the present invention comprise a very small layer of metal directly adhered to a surface of each region of conductivity and a solder connection 54 connecting a set of lead wires 56 to the device. The layer of metal is very adherent to the semiconductor substrate and is ohmic in nature.

The device can be a diode, or can have more than two regions of conductivity and more than two electrode contacts. The devices can be fabricated with simple or complex geometry in which various layers are lapped or undercut to achieve various electrical and mechanical functions. A very important junction diode type of device is the solid state junction laser illustrated in FIG. 4. Junction diodes 60 from certain compounds such as gallium arsenide, gallium phosphide, indium phosphide and others emit appreciable light when operated at high injection levels. By providing a high carrier concentration and maintaining the generated photons within the diode, the photons stimulate the emission of coherent radiation.

Figure 4:
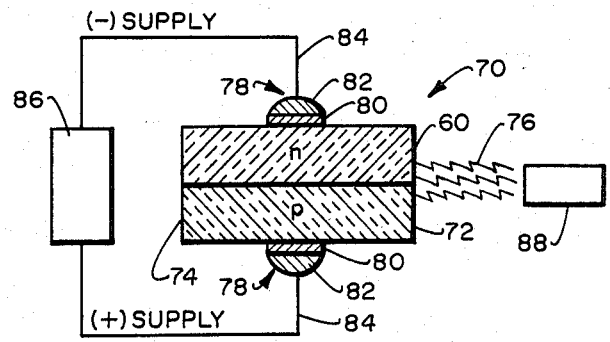
FIG. 4 is a schematic view of a solid state laser containing electrodes produced according to the present invention.

As shown in FIG. 4 the laser device 70 comprised the diode 60 having two partially reflective cleaved ends 72, 74 from which the coherent narrow beam 76 is extracted. Each end of the device also contains a very small electrode 78 comprising a small metal film 80 produced according to the invention, a solder connector 82 and lead wires 84 each connected to a continuous or pulsed power source 86. The laser 70 can be coupled to an optical fiber 88 which is part of a communication line. It has been found very difficult to apply metal contacts to the very small lasers being utilized in fiber optic communication systems.

Figure 5:
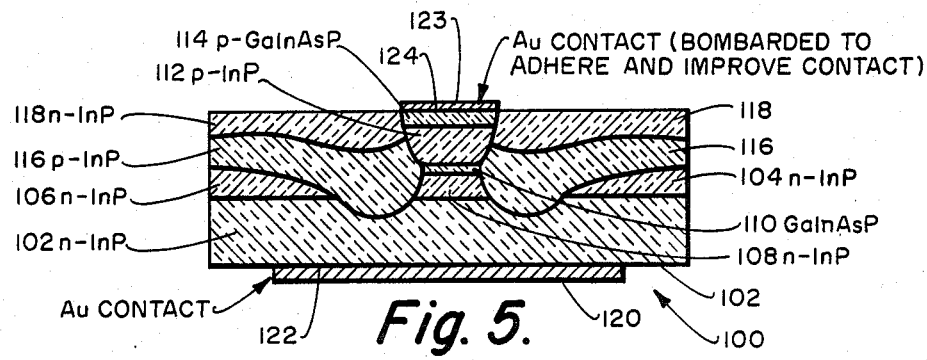
FIG. 5 is a schematic view of a typical buried heterostructure solid state laser.

Referring now to FIG. 5, solid state lasers 100 being produced and utilized at this time contain a complex structure. A typical structure contains a substrate 102 of n-type InP on which is deposited two side regions 104, 106 of n-InP. The central region 108 is in turn covered with a layer 110 of GaInAsP, a layer 112 of p-InP and a top layer 114 of p-GaInAsP. The central regions are surrounded by layers of p-InP 116 and n-InP 118. A gold contact 120 is applied to the bottom surface 122 of the substrate and a further gold contact 124 is applied to the top surface 124 of the layer 114. Either or both of the contacts can be bombarded to adhere and improve the adhesion and conductivity of the contact. The front contact may be extremely small of the order of 7000 Angstroms or less.

Though the thickness of the metal coating is not critical, the coating should be transparent to the high energy ion beam or to the beam utilized to generate high energy ions from suitable nuclei deposited onto or doped into the interface.

The other material forming the interface can be the same semiconductor, a different semiconductor, or can be an electric conductor. In many cases the second material will be a thin (a monolayer to 20 mils in thickness) coating of a metal such as gold, nickel, chromium, cadmium, copper, platinum, palladium, rhodium, tantalum, aluminum or silver, forming the electrodes or the printed lines of a printed circuit or an integrated circuit. The invention is particularly applicable to the noble metals that are most stable, that is, do not form oxides at room temperature, since these metals are the most difficult to deposit and form adherent bonds on substrates such as silicon or gallium or indium phosphide or arsenide.

The operating conditions and parameters do not appear to be critical except for the minimum energy requirements of the irradiating beam. The threshold energy appears to be related to velocity at the interface. The velocity of the ion appears to be adequate for effecting the bonding mechanism of the invention if the ions have an energy of at least 0.1 MeV/amu. If the energy is too great, unnecessary amounts of energy are utilized. Energies greater than 20 MeV/amu are not advisable because of the lower inherent efficiency. Certain substrates are more difficult to coat and adhere to than others and the run times have to be longer or more massive ions such as chlorine or fluorine are required. The velocities necessary for enhanced adhesion can be generated with protons, helium, chlorine or fluorine ions having from 0.1 to 20 million electron volts (MeV) per atomic mass unit (amu) and a dosage of at least $10^{12}$ ions per square centimeter.

The coating or adhering process is operated at ambient temperature. The pressure during irradiation can be reduced to avoid extraneous colisons between the energetic ions and molecules in the gas phase between the ion source and the coated substrate. The ions can be generated by a small accelerator. It is not difficult to generate 1 MeV ions. A Van de Graaff accelerator can generate high energy ions from any ion such as those from chlorine, fluorine, or helium or other noble gases such as neon, argon or krypton. It may be advantageous to employ a bombarding ion that is the same as the substrate so that no contamination occurs. Much thicker materials can be treated in the process of the invention by depositing an alpha emitter layer or doping one or other or both of the interfacial surfaces with elements such as boron, which is capable of emitting high energy charged particles under neutron bombardment through the nuclear reaction $^{10}B(n,a)^7Li$. On bombardment of $^{10}B$ with neutrons, 2 MeV alphas (a) are emitted which will result in adherence of the doped surface to the adjoining surface. Other elements that can be doped into or coated onto the surfaces are fissionable elements such as $U^{235}$. The use of microbeam accelerators can also be used to localize adhesion to small areas.

The following experiments were conducted by generating high energy protons, helium, chlorine and fluorine ion beams from the ONR-CIT tandem accelerator. The beam spot was defocused in most cases to a 0.2 cm long and 0.2 cm wide. The beam spot dose was uniform within a factor of 2.

The substrates were device grade silicon, InP and GaAs. The substrates were cleaned with trichloroethylene, HF and methanol before being loaded into a diffusion-pumped evaporator. 200 Å–500 Å thick films of gold or silver were evaporated onto substrates in a vacuum of $1 \times 10^{-6}$ Torr. After irradiation the adhesion of the films was tested by means of the "Scotch Tape Test": a piece of tape was firmly pressed on the irradiated surface and slowly peeled off by hand. The adhesion effect obtained after the high energy bombardment is so dramatic that more quantitative tests of adhesion were not necessary. In many cases, such as silver or gold on silicon, InP, and GaAs, the irradiated film could not be easily removed even by scraping with a sharp metal object.

EXAMPLE 1

A fluence of $5 \times 10^{14}/cm^2$ $^{35}Cl$ at 20 MeV produces a strong bond. A 500 Å Au film on semiconductor-grade silicon chip was bombarded with 20 MeV $^{35}Cl$ particles at a fluence of $10^{15}/cm^2$. The beam current was about 150 nA/cm² (+1 charge state), which allowed irradiation times of 20 min. or less. The power delivered by the beam was approximately 10 watt/cm². The tape easily pulled the Au from the unirradiated areas but the gold was strongly bonded in the irradiated area, resisting removal even when scratched with a sharp metal object. It was believed that the bonding was a result of a thin film of silicon dioxide. Therefore, the silicon chip was etched in HF to remove any oxide film and the gold film was applied and then bombarded according to the above procedure. Surprisingly, the film was more firmly bonded than without etching.

EXAMPLE 2

Au was also evaporated onto an InP and GaAs blank sample and irradiated as in Example 1. The irradiated areas were firmly adherent and the resistance was a factor of 10 lower than other methods of making contacts to these materials.

The invention is also useful in increasing the adherence of two metal surfaces, especially with metals that form weakly adherent bonds such as the noble metals unless they are applied electrolytically. The process can be utilized to form bi-metallic-film thermocouples, thermionic emitters by coating low work function metals onto higher work function metals or to plate with precious metals such as gold or platinum to form jewelry or to form catlaytically active surfaces, or to produce wear or corrosion resistant layers.

Figure 6:
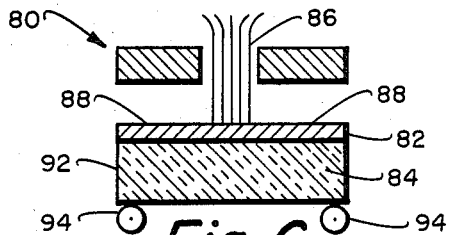
FIG. 6 is a schematic view of a metal-metal bonding assembly.
Figure 7:
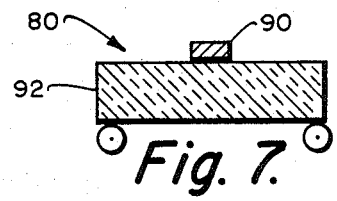
FIG. 7 is a schematic view showing selective bonding of a film of metal to a metal substrate.
Figure 8:
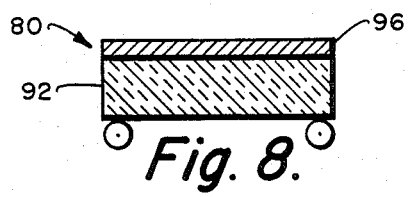
FIG. 8 is a schematic view illustrating bonding a metal film across the surface of a metal substrate.

Referring now to FIGS. 6, 7 and 8, a firmly adhered laminate 80 is formed by applying a thin film of metal 82 to a metal substrate 84. The film thickness is such that the film is transparent to the collimated high energy beam 86. After bombardment, the non-irradiated portions 88 of the film are easily peeled from the surface leaving a firmly adherent stripe 90 of metal. If the coated assembly 92 is translated past the beam 86 by means of rollers 94 a continuous layer 96 of metal will be provided.

EXAMPLE 3

A thick sheet of W was coated with a 500 Å thick film of gold and bombarded with a fluence of about $2 \times 10^{14}/cm^2$ of Cl at 20 MeV for an irradiation time of ten minutes. The gold film was firmly bonded to the W.

It is to be realized that only preferred embodiments of the invention have been described and that numerous substitutions, modifications and alterations are permissible without departing from the spirit and scope of the invention as defined in the following claims.

We claim:

1. A method of improving the adhesion of a first surface of a metal or a first semiconductor to a surface of a second semiconductor, each of said semiconductors having a resistivity below $10^3$ ohm-cm, a band gap from 0.01 eV to 5 eV and being an element selected from Groups III, IV or VI of the Periodic Table or a compound selected from III-V compounds or II-VI compounds comprising the steps of:
bringing the two surfaces into contact; and
applying high energy ions having an energy of at least 0.1 MeV/amu to the interface of the two surfaces for a period sufficient to improve adhesion.

2. A method according to claim 1 in which the ions have a dose of at least $10^{12}/cm^2$.

3. A method according to claim 1 in which the first surface is a thin film of metal.

4. A method according to claim 1 in which the metal is gold.

5. A method according to claim 1 in which the semiconductor is an element selected from silicon, germanium, selenium, tellurium or boron.

6. A method according to claim 1 in which the semiconductor is doped with charge carriers.

7. A method according to claim 1 in which the radiation is selectively applies to portions of the interface between said surfaces.

8. A method according to claim 1 in which the ions are generated at the interface.

9. A method according to claim 3 in which the film has a thickness from one monolayer to 20 mils and is selected from the group consisting of gold, nickel, chromium, cadmium, copper, platinum, palladium, rhodium, tantalum, aluminum or silver.

10. A method according to claim 6 in which the semiconductor contains a plurality of zones of opposite conductivity type.

11. A method according to claim 10 in which the semiconductor is capable of emitting light.

12. A method according to claim 11 in which the semiconductor is capable of emitting collimated, coherent light.

13. A method according to claim 7 further including the step of removing the non-adhered, non-irradiated portion from the surface of the semiconductor.

14. A method according to claim 8 in which the ions are generated by disposing fissionable elements or compounds that undergo nuclear reation having charged particles as the reaction product, or neutron activatible, charge particle emitting compounds at said interface.

15. A method according to claim 14 in which said elements or compounds are doped into one of said surfaces.

* * * * *